US009817122B2

(12) United States Patent
Metzler et al.

(10) Patent No.: US 9,817,122 B2
(45) Date of Patent: Nov. 14, 2017

(54) ELECTRO-OPTICAL DISTANCE MEASURING DEVICE (75) Inventors: Reto Metzler, Rebstein (CH); Bernhard Fiegl, Marbach (CH); Kurt Giger, Rüthi (CH)

(73) Assignee: LEICA GEOSYSTEMS AG, Heerbrugg (CH)

( * ) Notice: Subject to any disclaimer, the term of this patent is extended or adjusted under 35 U.S.C. 154(b) by 764 days.

(21) Appl. No.: 14/343,024

(22) PCT Filed: Sep. 4, 2012

(86) PCT No.: PCT/EP2012/067229
§ 371 (c)(1),
(2), (4) Date: Apr. 9, 2014

(87) PCT Pub. No.: WO2013/034555
PCT Pub. Date: Mar. 14, 2013

(65) Prior Publication Data
US 2014/0226147 A1 Aug. 14, 2014

(30) Foreign Application Priority Data
Sep. 6, 2011 (EP) .................................. 11180282

(51) Int. Cl.
*G01S 17/10* (2006.01)
*H01S 5/042* (2006.01)
(Continued)

(52) U.S. Cl.
CPC .............. *G01S 17/10* (2013.01); *G01B 11/14* (2013.01); *H01S 5/0014* (2013.01);
(Continued)

(58) Field of Classification Search
CPC ...... G01S 7/4861; G01S 17/10; G01S 7/4873; G01C 3/08
See application file for complete search history.

(56) References Cited

U.S. PATENT DOCUMENTS

| 4,845,720 A | 7/1989 | Koishi |
| 5,287,375 A | 2/1994 | Fujimoto |

(Continued)

FOREIGN PATENT DOCUMENTS

| CN | 1525461 A | 9/2004 |
| CN | 1574522 A | 2/2005 |

(Continued)

OTHER PUBLICATIONS

European Search Report dated Jan. 26, 2012 as received in Application No. EP 11 18 0282.

*Primary Examiner* — Luke Ratcliffe
(74) *Attorney, Agent, or Firm* — Maschoff Brennan (57) ABSTRACT An electro-optical distance measuring device includes a laser driver for a laser diode for emitting laser light pulses. The laser driver has a laser diode voltage supply for providing a voltage below a laser threshold voltage of the laser diode, an inductive component in a supply path of the laser diode, and an electronic switching element. The electronic switching element is arranged in an interacting manner such that a current flow through the inductive component can be generated in a first switching position of the switching element and the current flow can be conducted through the laser diode in a second switching position of the switching element. One of the laser light pulses can be emitted as the result of a switch from the first switching position to the second switching position, and laser light cannot be emitted in the static first switching position or the static second switching position.

17 Claims, 7 Drawing Sheets

(51) Int. Cl.
*H01S 5/068* (2006.01)
*H03K 3/57* (2006.01)
*G01B 11/14* (2006.01)
*H01S 5/00* (2006.01)
*G01S 7/484* (2006.01)

(52) U.S. Cl.
CPC ........ *H01S 5/0428* (2013.01); *H01S 5/06825* (2013.01); *H03K 3/57* (2013.01); *G01S 7/484* (2013.01)

(56) References Cited

U.S. PATENT DOCUMENTS

| | | | |
|---|---|---|---|
| 5,895,984 A | 4/1999 | Renz | |
| 6,864,966 B2 | 3/2005 | Giger | |
| 7,184,130 B1* | 2/2007 | Barr | G01S 7/4861 356/4.01 |
| 7,599,412 B2 | 10/2009 | Vogel et al. | |
| 2004/0240133 A1 | 12/2004 | Lee et al. | |
| 2012/0189028 A1* | 7/2012 | Hoffman | H01S 5/4018 372/38.07 |
| 2013/0314711 A1* | 11/2013 | Cantin | G01S 17/10 356/445 |

FOREIGN PATENT DOCUMENTS

| | | | |
|---|---|---|---|
| DE | 195 46 563 A1 | 6/1997 | |
| EP | 0 314 390 A1 | 5/1989 | |
| EP | 0 644 591 A1 | 3/1995 | |
| EP | 0 597 644 A2 | 7/1995 | |
| EP | 0 780 937 A1 | 6/1997 | |
| EP | 1 311 873 B1 | 8/2011 | |
| EP | 01 957 668 B1 | 8/2011 | |
| EP | 2600168 A1 | 6/2013 | |
| JP | 07-079042 A | 3/1995 | |
| JP | 2008-227408 A | 9/2008 | |
| JP | 2008227408 * | 9/2008 | ............ H01L 33/00 |

* cited by examiner

ELECTRO-OPTICAL DISTANCE MEASURING DEVICE

FIELD OF THE INVENTION

The invention relates to an electro-optical distance measuring device comprising a safe laser driver and an actuation method for a semiconductor laser in an electro-optical distance measuring device, in particular a method for generating a laser pulse

BACKGROUND

The general guidelines in respect of laser safety (for example in accordance with EN 60825, ANSI 2136 or corresponding to the "International Commission on Non-Ionizing Radiation Protection") demand that a laser light source can only be operated such that it does not pose any hazards. In this case, depending on the wavelength emitted, limit values for the thermal power density or the energy density need to be adhered to. Eye safety is of primary importance in laser devices since the eye, owing to its function, reacts most sensitively to electromagnetic radiation and damage to the retina or cornea can occur as a result of direct, indirect or scattered laser beams. This applies in particular since studies have shown that, even in the case of visible light, it generally cannot be assumed that the lid closure reflex protects the eye. Laser devices need to be classified corresponding to these specifications and to be identified correspondingly, which could also include safety testing and certification.

In the case of a large number of laser devices, for example electro-optical measurement devices such as laser distance measuring devices or laser levelers, laser projectors, laser scanners, etc., the emergence of the laser light from the housing of the device is absolutely necessary for functional reasons. A minimum optical energy is also often required for functional reasons, and this minimum optical energy would be above the nonhazardous limit if this were to be emitted in the continuous-wave operating mode. Therefore, the lasers in such devices are usually operated in pulsed fashion. In order to guarantee eye safety, the laser sources need to be equipped with corresponding protective measures in order to adhere to relevant standards and specifications. This applies not only in the conventional operating case, but also under so-called "single-fault conditions", which all cover any fault scenarios in which a single fault occurs on its own (for example failure of individual component parts, short circuit, conductor track breakage, etc.). In this case, even in the event of failure of any component, for example, it is necessary to ensure that, despite the occurrence of such a single fault, the laser power occurring falls to below the upper power limit of the corresponding laser class within fractions of a second in order to rule out damage to the eye. During pulsed operation, care should be taken, using special measures, to ensure that continuous emission with the peak pulse values which are above the limit values can also be ruled out in the event of a fault. Such single-fault tests need to be correspondingly carried out and verified by the manufacturer of the laser device.

Depending on the laser class and the application case, two-fault or multiple-fault failsafety can also continue to be required, in which, even in the event of the simultaneous occurrence of more than one fault, evidence needs to be given of the safety to the effect that the emitted laser power does not in any way exceed the limit values and therefore a risk to the user can be ruled out. The single-fault failsafety described in this document also represents a basic precondition which in any case needs to be met in these cases, which basic precondition can be developed by corresponding further measures.

The conventional solution for producing laser safety is the direct monitoring of the emitted laser power with the aid of a monitor diode. In this case, some of the emitted laser light is directed onto a photosensitive element, for example a photodiode or a phototransistor, which provides an electrical signal which is dependent on the light intensity. A monitoring circuit, for example in the form of a microcontroller or a discrete circuit (possibly even a mandatory one in the case of safety-relevant circuit parts), can thus monitor the presently emitted laser power and possibly disconnect the laser in the event of a limit value for the emitted laser energy or laser power being exceeded.

For example, documents EP 0 314 390, U.S. Pat. No. 5,287,375, EP 0 780 937, EP 0 664 591 and EP 0 597 644 disclose a wide variety of laser driver circuits which all have a monitoring circuit with a monitor diode, to which some of the light emitted by the laser diode is applied and with the aid of which the present output power of the laser diode can be determined. In the event of a fault, for example in the event of a short circuit of a power transistor in the output stage of the laser diode actuation, the supply of electrical energy to the laser diode can be reduced or suppressed on the basis of this information by means of a correspondingly designed safety circuit.

Owing to the general nature of the laser safety provisions or else owing to regulation of the output power of the laser diode which is often required depending on the application, a large number of commercially available laser diode components are already equipped with a corresponding monitor diode. Laser diodes also often have considerable manufacturing tolerances, temperature dependencies or ageing effects, which can be compensated for by determination of the actual optical output power. The circuitry complexity for such monitoring is really high and also correspondingly cost-intensive. The complexity of evaluating the analog and often interference-susceptible signal of the photosensitive monitoring element, often in the form of a photodiode, thus remains. Often such a safety circuit also needs to be implemented in a manner which is safe and certifiable, supported by corresponding evidence, which can additionally increase the complexity in terms of circuitry, in particular since the realization of safety-relevant circuit parts is often linked to stringent conditions and documentation specifications.

In addition, during pulsed operation of laser diodes, during which only very short light pulses with a high peak power are emitted, owing to the steep switching edges occurring in the process in the electronic circuit and high peak currents, corresponding electromagnetic interference signals (crosstalk, etc.) are to be expected, which disrupt the evaluation (which usually takes place at high resistances) of the measurement signals of a monitor diode and can complicate this. The short pulse duration of the emitted light and the corresponding monitor signals can also make monitoring of the actually emitted average light energy more difficult.

In this case, the laser pulses are emitted multiply in packets of pulses, so-called "bursts", as is described, for example, in EP 01 957 668. After a packet with a number of short laser pulses in quick succession, there is a dead time in which no laser emission takes place and which is markedly longer than the intervals between the pulses within the packet.

JP 7 079042 discloses the use of a pulse-shaping network in order to supply a current pulse which does not have any interference to a laser diode.

JP 2008 227408 describes an energy-efficient increase in a DC voltage by means of a step-up converter for supplying power to a series circuit comprising a plurality of light-emitting diodes with a forward voltage which is greater than the DC voltage.

SUMMARY

One object of the present invention therefore consists in improving the actuation of a laser diode, in particular whilst adhering to safety specifications.

One object also consists in providing a safe laser driver for pulsed or burst operation, which can be realized more easily and at less expense and has, for example, decreased complexity in terms of components and evaluation.

A subordinate object is in this case also providing a laser driver which can be produced in highly integrated form, i.e. in addition to a conventional printed circuit board design also using thick-layer technology, thin-layer technology or an ASIC, for example.

A further object consists in achieving laser safety using a circuit in which no analog monitor signals of a photosensitive element are evaluated in the safety circuit, in particular in which no analog-to-digital conversion (ADC) is required.

A subordinate object also consists in actuating a laser diode, in accordance with safety standards, which has fewer electrical connections than a laser diode equipped with a monitor diode, in particular a two-pole laser diode with an SMD design.

The development of a laser driver circuit with single-fault failsafety which manages without a monitor diode is also an object of the present invention.

Likewise, the provision of a laser driver as an ASIC, in particular with a purely digital interface to the outside, is an object of the present invention.

Furthermore, a safe laser driver according to the invention for a laser diode of an electro-optical distance measuring device for emitting laser light pulses with a laser diode voltage supply, for providing a voltage which is below a laser threshold voltage of the laser diode is described. As a result, during steady-state application of the voltage at the laser diode, no laser light can be emitted.

The laser driver also has an inductive component in a supply path of the laser diode, in particular electrically connected to the laser diode, and an electronic switching element.

In this case, the switching element is arranged interactively in such a way that, in a first steady-state switching position of the switching element, a current flow through the inductive component can be produced and, in a second steady-state switching position of the switching element, the current flow can be conducted through the laser diode, especially with the inductive component in the circuit between the voltage supply and the laser diode and in particular with a switching element connected electrically in parallel with the laser diode.

Only in the event of a change from the first to the second switching position can one of the laser light pulses be emitted. A single one of the laser light pulses which can be emitted in the event of a change from the first switching position to the second switching position has an energy which is limited by the energy stored in the inductive component owing to the current flow, and also the average emitted laser power of a group of laser light pulses is thus limited.

In particular, the laser driver can thus have a safety circuit without any monitor diodes for maintaining a maximum permissible average laser power.

Therefore, a safety circuit without any monitor diodes can thus be used to ensure that a maximum permissible emission power corresponding to laser safety guidelines is adhered to, specifically also in the single-fault case, for example in the case of failure or short circuit of a component or element of the laser driver.

A basic concept of the present invention consists in that the DC forward voltage used to supply the laser diode is below the laser threshold of the laser diode. This means that the laser diode cannot emit laser light in the DC case. If in the case of direct application of the supply to the laser diode (for example in the event of a short circuit), there is no stimulated or intensified emission, but in any case only a weak, spontaneous, non-intensified emission of photons, similar to a light-emitting diode. Thus, in this operating or fault state, the laser safety is ensured.

In order nevertheless to be able to emit laser light during pulsed operation, in an exemplary embodiment used for explanatory purposes, an inductively acting component is in series with the laser diode and a switching element by means of which the laser diode can be short-circuited is in parallel with the laser diode. The sequence for the emission of a laser pulse is as follows:

1. A pulse generator switches the switch in parallel with the laser diode. As a result, the supply voltage (which is below the laser threshold, as described) is present at the inductive component.

2. A current is impressed in the inductive component. This current flows from the voltage source via the inductive component and the switch to ground.

3. The pulse generator opens the switch.

4. Since the current in the inductive component, despite the open switch, nevertheless continues to remain, this current now needs to flow through the laser diode. The potential at the anode of the laser diode is elevated to above the laser threshold and the stimulated emission of a laser pulse begins. The maximum energy of the pulse is in this case restricted by the energy stored in the inductive component, however.

If the current has decreased and the voltage at the anode of the laser diode has decreased to below the laser threshold voltage, the laser emission is also at an end.

5. The process can be repeated with step 1.

The laser pulses can therefore be emitted as individual pulses or in pulse packets (bursts) or as a continuous pulse sequence. The switch can remain closed or open between the pulses or bursts. In both cases, the laser will not emit any light.

If the switch is open, a possible current in the inductive component decreases via the laser diode, and the voltage across the laser diode falls to below the threshold (approximately to the level of the supply voltage). Since the supply voltage is below the threshold voltage, in the case of a switch which is open in the steady state, no laser light is produced. Therefore, in this steady operating state, no laser emission is possible.

If the switch is closed, the current flows through the switch and not through the laser diode, as a result of which, in this steady operating state, likewise no laser emission is possible. The laser diode is short-circuited by the switch, and therefore the voltage and the current at the laser diode are approximately zero, in any case below the threshold values.

Only in the event of a change from the closed switch to the open switch is emission of the laser diode possible, but in this case also with a defined upper limit for the possible pulse energy. In no case is continuous-wave emission of laser light possible.

The laser power can be adjusted via the number of pulses per burst or the pulse repetition rate within the burst. For example, this can be determined or adjusted during production of the laser or assembled laser device in the context of function testing or calibration. The energy of an individual pulse can also be influenced by means of adjusting the duty factor of the pulse generator during pulse generation. For example, the pulse energy can also be influenced via the durations of the two switching states during "charging" and "discharging" of the inductance. However, it is not possible for a maximum individual pulse energy to be exceeded which is determined from the maximum current when the switch is closed in the steady state and the amount of energy stored in the inductance, associated therewith. If, for example, the parameters of the pulse generator are limited on the basis of a worst case scenario, the laser safety limits being exceeded can in any case be ruled out. Thus, the laser driver according to the invention can be designed such that laser safety can be guaranteed in any case.

Ageing effects merely make the laser less efficient, and therefore the laser power will decrease slightly over time, but in no case will it exceed the limit set during production. An ageing-related power drop could, if necessary, also be compensated for by renewed determination of the actually emitted power and adjustment of the pulse or burst parameters.

In a further embodiment, the supply voltage of the laser driver or the entire system can very easily be above the laser threshold voltage. As a result, a power supply to the peripheral logic circuits, processors, communication modules, etc. with voltages which are conventional for this, and are often above the laser threshold, is enabled, for example. A step-down converter or series regulator (LDO) can in this case supply a correspondingly lower voltage, which is regulated and is independent of the supply, and which is below the laser threshold voltage, to the laser diode or the inductive component connected upstream thereof. The laser driver can in this case also be in the form of an ASIC, wherein the LDO can either be arranged externally or can be integrated directly in the ASIC.

In such an embodiment in which voltages above the laser threshold are provided in or around the laser driver, however, an additional fault case is possible, in which the safety would no longer be ensured purely on the basis of the above-explained circuit or method according to the invention, namely a short circuit between the relatively high supply and an electrical grid in the supply of the laser diode.

Such a short circuit can be identified by additional monitoring of the laser diode supply voltage. For example, this can be identified by a short-circuit detection circuit (SCD) and signaled to a superordinate microcontroller by means of a digital signal or supplied directly to a safety shutdown. The SCD can in this case also be integrated directly in the LDO and/or the laser driver, for example, especially the system deviation occurring at the LDO could be used for establishing an overvoltage, for example. This can, in the event of a fault, isolate the now excessively high forward voltage from the inductive component and/or the laser diode by means of an additional (independent) switching element. Alternatively, the additional switching element can also be used to isolate the entire laser driver from the supply voltage which is above the laser threshold. In this case, an additional safety device to protect against automatic reconnection may be provided.

Alternatively, the laser diode supply voltage can also be monitored by a voltage measurement, comparator circuit or the like. Even with respect to the additional shutdown in the event of a fault, there are functionally equivalent alternative solutions with which the required safety conditions can likewise be met.

BRIEF DESCRIPTION OF THE DRAWINGS

The method according to the invention and the apparatus according to the invention will be described in more detail below purely by way of example using specific exemplary embodiments, which are illustrated schematically in the drawings. In this case, details are also given of the further advantages of the invention. Specifically.

DETAILED DESCRIPTION

Figure 1:
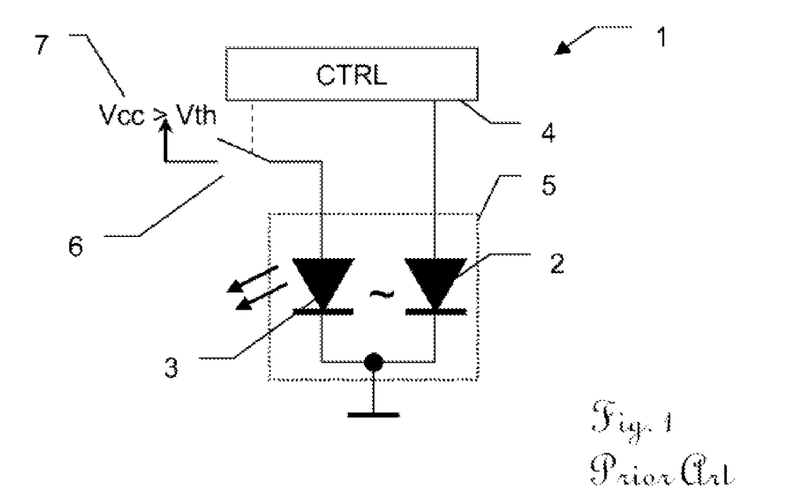
FIG. 1 shows a schematic of a laser diode conventional in the prior art having a monitor diode for ensuring or monitoring laser safety.

FIG. 1 illustrates a laser driver 1 known from the prior art with safety monitoring, in which the laser power emitted by the laser diode 3 is monitored by a safety controller 4 with the aid of a monitor diode 2. In the event that the limits established by standards are exceeded, continued supply of energy to the laser diode 3 is suppressed, for example by opening of the switch 6. Frequently, in this case the monitor diode 2 is already accommodated by the laser diode manufacturer in the same housings 5 as the laser diode 3 (wherein other initial circuitry of the two elements than that illustrated here are also conventional). In order to be able to emit laser light, a supply voltage 7 (Vcc) which is greater than the laser threshold voltage (Vth) of the laser 3 is required, which is applied to the laser diode for the emission of a pulse for the desired pulse duration.

For monitoring by the safety controller 4, the analog output signal of the photodiode 2 needs to be evaluated and possibly shutdown needs to be performed in the event that the safety limits are exceeded. For example, the shutdown can take place by isolation of the supply by means of the switch 6, which advantageously represents a second, independent entity with respect to that circuit which generates the laser pulses. Since this circuit part is safety-relevant, certain design specifications can apply, for example a purely software solution of safety-relevant parts can be impermissible or can at least be subject to stringent design specifications.

Figure 2:
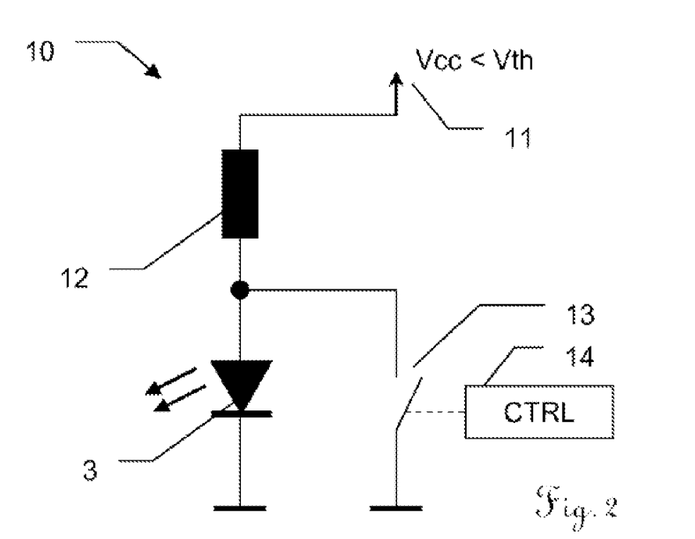
FIG. 2 shows an electronics schematic of a first embodiment of a laser driver according to the invention for explaining the basic principle.

FIG. 2 shows a safe laser driver 10 according to the invention for pulsed operation of a laser diode, in which it is possible to dispense with a monitor diode in respect of the single-fault laser safety.

As already explained above, the supply voltage 11 (Vcc) of the laser diode 3 is designed in such a way that it does not exceed the laser threshold voltage (Vth) of the laser diode 3. The laser threshold voltage Vth is that voltage which drops across the laser diode 3 and at which the population inversion in the semiconductor is precisely so high that stimulated emission (or "lasering") begins. As an alternative to the threshold voltage, a laser threshold current can possibly also be cited in data sheets, but a person skilled in the art can determine the voltage necessary for impressing this current, and therefore the limiting voltage, in a known manner from this laser threshold current.

In this embodiment, the laser diode 3 is connected with its cathode to zero potential GND and with its anode via an inductive component 12 to the supply voltage 11. Since the supply voltage 11 is too low to trigger stimulated emission, the laser diode can emit, at most, light generated by spontaneous emission with an intensity which is in any case below the permissible limit values, in particular since such an emission is also not "laser light" in the actual sense. It is obvious that the arrangement of the components could also be implemented differently in a functionally equivalent manner (for example horizontally in mirrored fashion with the inductance on the cathode side, etc.).

If the switching element 13 (which can be in the form of a transistor, for example especially in the form of a field-effect transistor) is closed, the laser diode 3 can likewise not emit any laser light. The laser diode is short-circuited by the switch, for which reason the current flows via the switch and not via the laser diode 3.

A further advantageous secondary effect can in this case also be that the laser can be operated, for example, directly on a battery voltage below the laser threshold without this voltage first needing to be raised by means of a step-up converter required specifically for this to above the threshold level.

Figure 3:
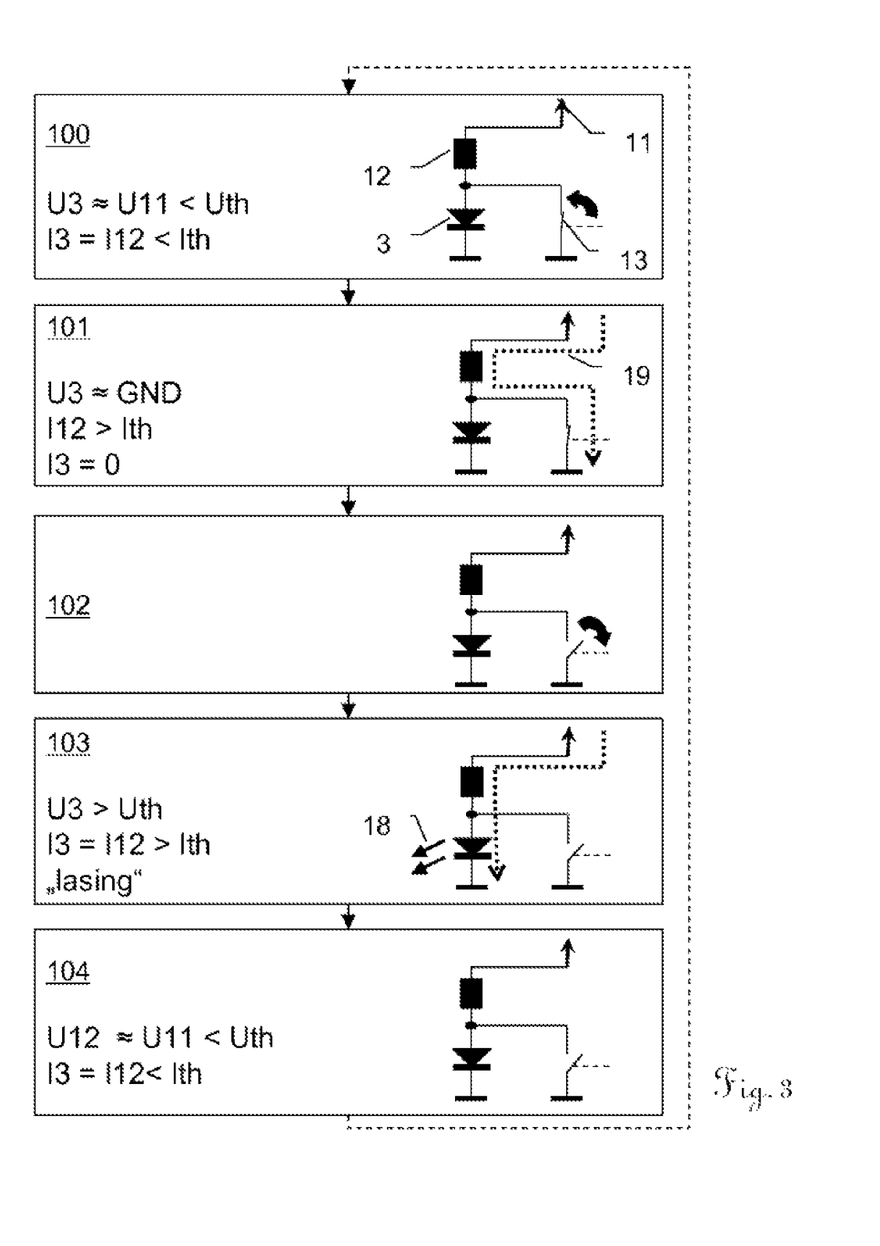
FIG. 3 shows an exemplary flowchart of laser pulse generation according to the invention.

The circuit according to the invention is designed for emitting pulsed laser radiation, in particular pulse packets (bursts). FIG. 3 illustrates an exemplary flowchart of the laser pulse generation according to the invention. The reference symbols in the electrical schematic in each case remain the same and are only illustrated once in each case for reasons of clarity.

In step 100, the switch 13 is closed. Shortly before closing of the switch 13, the supply voltage V11, which is below the laser threshold voltage Vth, is present at the series circuit comprising the inductance 13 and the laser diode 3. The same current I3 and I12, which is very low below the threshold voltage Uth (or the threshold current Ith) owing to the exponential current-voltage characteristic of the laser diode, flows through the laser diode 3 and the inductance 12, respectively. Excessively low population inversion prevails in the laser diode than would make stimulated emission of laser light possible.

After closing of the switch 13, the supply voltage V11 is present at the inductance 13 as voltage V12.

As illustrated in step 101, a current 19 builds up in the inductance 12 as I12 in accordance with the known function $$1 - e^{-\frac{t}{i}},$$

which current flows away via the switch 13. The laser diode 3 is in this case short-circuited and both the voltage U3 and the current I3 are virtually zero. Therefore, no light can be emitted.

In step 102, the switch 13 is opened. As shown in step 103, the current 19 now flows further in the inductance 12 owing to the continuity condition, but it now flows as I3 via the laser diode 3 instead of via the now open switch 13. The voltage U3 via the laser diode 3 increases correspondingly to above that of the laser threshold, namely the laser diode emits laser light which is symbolized by the arrows 18 now provided.

Since the current now decays in accordance with a function $$e^{-\frac{t}{i}}$$

until the state of equilibrium is reached, in which the voltage level U12 approximately corresponds to the supply U11, i.e. is below the laser threshold Uth and correspondingly current I3 through the laser diode 3 has dropped below the associated threshold current Ith, no laser light 18 is emitted any more either.

The switching times of the switch 13 can in this case be selected freely by the pulse generator circuit 14, i.e. for example also during the buildup or decay of the current 19, as a result of which, for example, the pulse shape and/or the pulse energy can be varied.

The laser pulse generation procedures according to the invention or the methods for generating a laser pulse by means of a laser diode according to the invention can be described in other words by:

supplying a supply voltage, which is below a laser threshold voltage of the laser diode, to the laser diode via an inductive component;

building up a current through the inductive component by closing a switching element arranged in parallel with the laser diode;

decreasing the current across the laser diode whilst emitting the laser pulse by opening the switching element.

Figure 4:
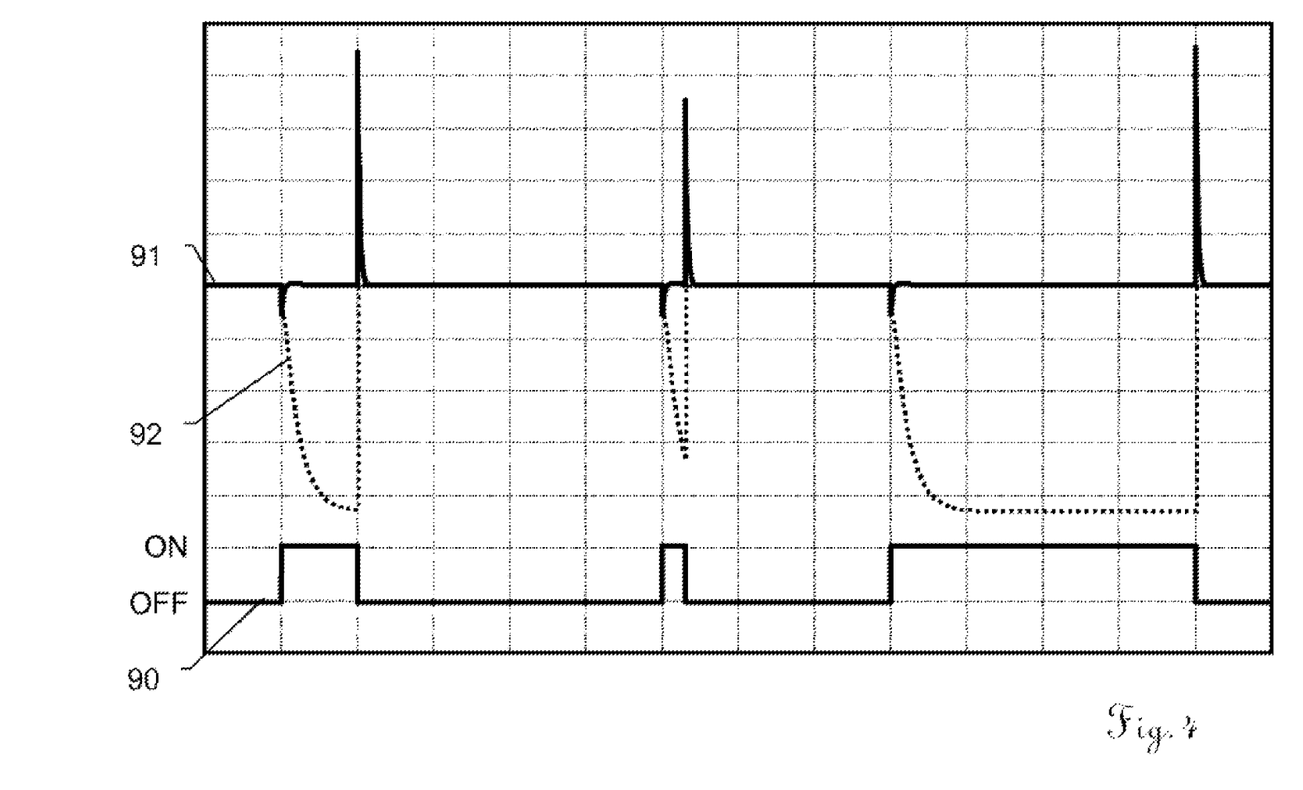
FIG. 4 shows a graph illustrating an exemplary current-voltage profile in the case of a laser driver according to the invention.

The diagram in FIG. 4 shows exemplary current profiles at the laser diode 3, as graph 91 (continuous line), and at the inductive component 12, as graph 92 (dotted line). The inductive component can be in the form of a wound coil, a correspondingly shaped conductor track section or SMD inductance, for example. An embodiment of the inductive component in the form of an inductive transformer, for example similar to the basic structure of a flyback converter with the laser diode as load, can likewise be used as a particular form for achieving the laser safety according to the invention without a monitor diode. The graph 90 shows the state of the switch 13, where ON means closed and OFF means open. It can clearly be seen that, in both steady switching states, the diode current is zero or in any case below the laser threshold. Only once the switch has opened does the current which has previously flowed through the inductance flow via the laser diode 3 owing to the continuity condition of the inductive component before this current has decayed or before the switch 13 is closed again. As illustrated by the second pulse, the pulse energy can also be varied by a relatively short switch-on time of the switch 13, in which the current through the inductance 12 has not yet reached the saturation value. In contrast to an approach involving the pulse energy variation with the switch closed in the quiescent state, in this case in total less current flows per pulse, which has a positive effect on the energy efficiency of the circuit. In respect of laser safety, however, in both cases the maximum possible pulse energy should possibly be taken into consideration in the event of a fault in a switch 13 which is clocked too slowly or the occurrence of such a fault should be correspondingly prevented by further measures. In particular when the inductive component is in the form of a pulse-shaping network, the shape of the optical pulse generated can be kept at least approximately identical in the event of variation of the switch-on duration of the switch and primarily only its peak value and therefore also the pulse energy can be varied, as is illustrated also by the second pulse in graphs 92 and 92. The third pulse illustrated shows saturation of the inductive component which limits the maximum achievable pulse energy. The inductive time constant in this case restricts the maximum possible pulse repetition rate.

Figure 5A:
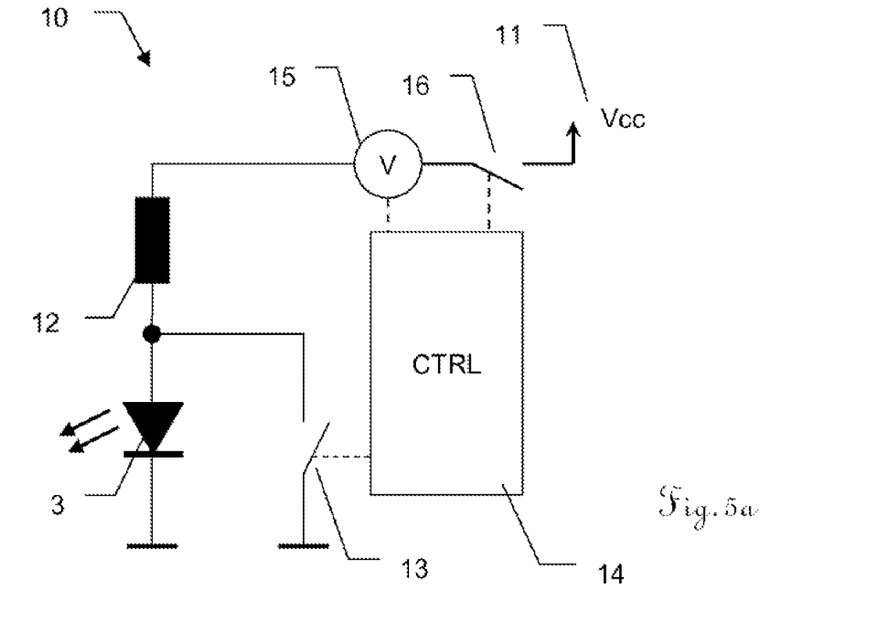
FIG. 5a shows an exemplary electronics schematic of a second embodiment of a laser driver according to the invention with supply voltage monitoring.

FIG. 5a illustrates an embodiment in which, in order to increase safety, in addition monitoring 15 of the laser supply voltage for possible instances of the threshold being exceeded is performed. If a voltage which is above the laser threshold is established in an electrical grid of the laser diode supply, a corresponding measure is taken to prevent emission of laser light. The measures illustrated by way of example are either closing of the switch 13, as a result of which the laser diode 3 is short-circuited, and additionally, or as an alternative, disconnection of the supply 11 via a further, independent switch 16. The disconnection of the supply can in this case affect the entire laser system, the laser driver 10 or the laser diode 3. In respect of the specific arrangement of the further switch 16 for safety shutdown, other, functionally equivalent, possibilities are also known to a person skilled in the art, for example a low-side switch in the lower branch of the laser diode, etc. Thus, for example, in addition to the use of the switching element 13, a further switching element 16 can also be arranged for short-circuiting the laser diode 3, i.e. in parallel with the switching element 13, with the result that, in the closed state of said switching element 16, no laser light 18 can be emitted, and in particular the further switching element 16 can be actuated on the basis of the detection of the voltage monitoring circuit 15.

Such an embodiment also enables the presence of voltages above the laser threshold voltage in the device or on the laser driver. Even in the event of a fault of a short circuit of the critical supply voltage with respect to an electrical grid of the laser diode, the circuit in this case meets safety specifications, for example, if logic elements, a processor, communications modules, etc., which operate at a level of 2.5 V, 3.3 V, 5 V or 12 V, for example, which is above the threshold voltage, for example of 1.8 V to 2.2 V in the case of infrared laser diodes, are provided on the same printed circuit board.

The relatively high voltage can in this case be stepped down correspondingly for the supply to the laser diode in a known manner by a linear or clocked voltage regulator.

Figure 5B:
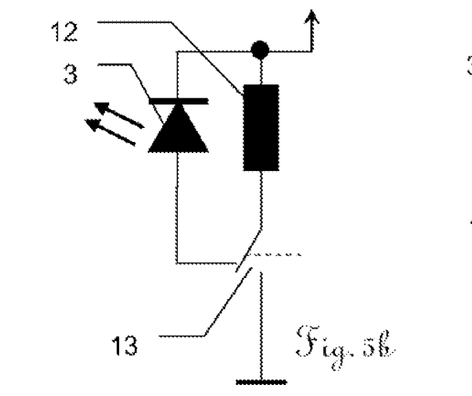
FIG. 5b shows an electronics schematic of a first exemplary alternative arrangement of the components in a laser driver according to the invention.
Figure 5C:
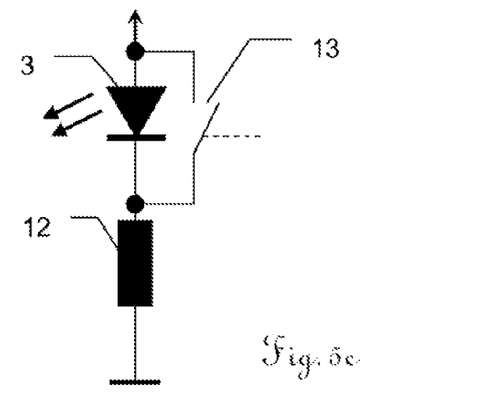
FIG. 5c shows an electronics schematic of a second exemplary alternative arrangement of the components in a laser driver according to the invention.

FIG. 5b and FIG. 5c illustrate two examples of alternative arrangements of the components with which a laser diode driver operating in accordance with the invention can be implemented, wherein further alternatives for the component arrangement with which the principle according to the invention can be realized are also known to a person skilled in the art.

Figure 6:
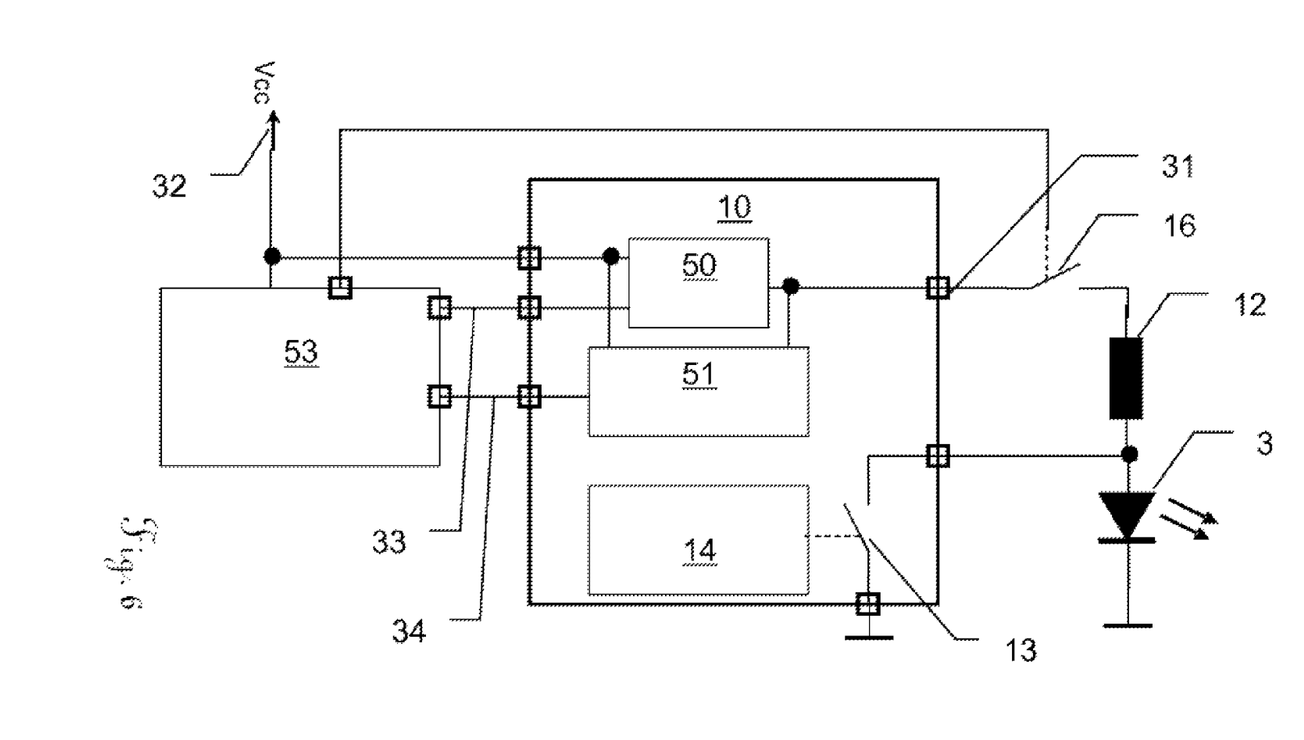
FIG. 6 shows an exemplary block circuit diagram of a third embodiment of a laser driver according to the invention in a larger context.

FIG. 6 shows a block circuit diagram of a system comprising a monitoring or communications processor 53 and a laser driver 10, which actuates the laser diode 3 for emission of light pulses. The processor 53 and the laser driver 10 are in this case supplied from a system supply 11, which is above the laser threshold level.

In this exemplary embodiment, the laser driver 10 is in the form of an ASIC, by way of example. A series regulator 50 (for example an LDO) in the laser driver ASIC 10 supplies a constant voltage which is independent of the system voltage 32 and which is below the laser threshold voltage to the laser diode output 31.

A fault case in which a short circuit occurs between the system voltage 32 and the laser diode output 31 is identified by the installed short-circuit detection circuit 51 (SCD) and signaled to the processor or microcontroller 53 by means of a digital fault signal 33, for example via a digital signal or via a communications channel. The superordinate controller 53 can disconnect the now excessively high forward voltage from the coil 12 and the laser diode 3 via the switching element 16. In any case, such a disconnection can also be triggered directly by the fault signal 33. In other words, the disconnection of the laser diode 3 by the switch 16 is only canceled if the voltage at the laser diode output 31 is in the safe range below the laser threshold.

In the embodiment illustrated, the LDO additionally has an enable input 34, which can additionally suppress or allow the provision of the laser supply voltage. This can be used as a further safety circuit for preventing undesired emission.

Also contained in the exemplary laser driver ASIC is the pulse generator 14, which actuates the switch 13 and determines the pulse sequence (for example: on time, off time, pulse repetition rate, pulse duty factor, burst duty factor, burst repetition rate, pulses per burst, etc.). This can be configured and triggered via a communications interface (for example single-wire interface, SSI, SPI, I2C, UART, . . . ) instead of or in addition to the lines 33/34 from the superordinate controller 53. The actuation of the switch 13, which is likewise integrated in the ASIC 10 in this illustration, can be realized, for example, as a PWM signal (with any desired configuration) for generating the desired starting pulse sequence.

The switch 13, for example a MOSFET transistor output, is connected to the laser diode in the above-described manner.

If the pulse shape of an emitted laser pulse which is achieved by the circuit does not meet the requirements of the application, this pulse shape can be adapted in a wide variety of ways. Firstly, the pulse shape is determined from the identification numbers of the inductive component (specifically from the inductance value, but also from the parasitic parameters, such as series resistance, etc.). Then, the inductance can also be replaced or supplemented by a more complex pulse-shaping network, for example by a parallel and/or series arrangement of resistors and/or capacitors (wherein the in principle inductive character needs to be retained for functional reasons). Such a pulse-shaping network can also be introduced into the GND branch of the laser diode, for example.

In addition, the pulse shape can also be adapted by corresponding actuation of the switching element 13, for example the end of the pulse can be "chopped" by renewed switching-on of the switch 13 still during the pulse emission, and therefore the pulse shape can be trimmed more to a rectangle. The output power of a pulse can also be adjusted via the pulse width (determined by the OFF time and/or ON time of the switch 13). In the case of a pulse generator with a correspondingly quick response, PWM modulation can also be achieved within one pulse, as a result of which, in particular in the case of corresponding smoothing of the PWM modulation within the pulse by the pulse-shaping network, the shape of the emitted pulse (intensity profile over time) and/or the pulse energy can be configured.

A laser driver as is illustrated in this embodiment can also be produced in a highly integrated form, for example using thick-layer technology, thin-layer technology or as an ASIC, wherein a reduced physical size also brings advantages in respect of the emission of electromagnetic interference. In addition, the number of external connections required can be reduced to the obligatory supply connections, two laser diode outputs and a communications interface for the superordinate processor (for example as two-conductor communication), possibly with an enable input and a fault output. If the application requires it, a trigger, clock and/or phase reference signal for the pulse generator 14 can also be added to this.

Figure 7:
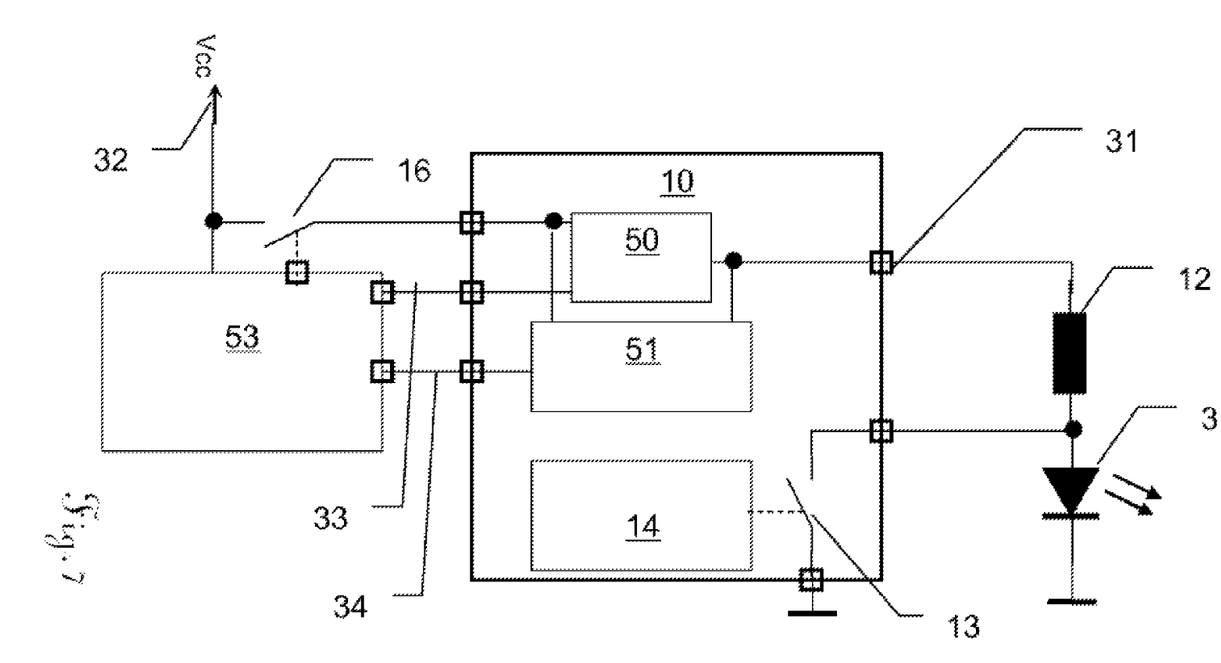
FIG. 7 shows an exemplary block circuit diagram of a fourth embodiment of a laser driver according to the invention with alternative overvoltage shutdown.

FIG. 7 shows an alternative to the previous circuit, in which, in the event of a fault, the supply voltage to the entire laser driver is disconnected from the system voltage by a switch 16. In a further embodiment, the switch 16 can possibly also be integrated in the laser driver 10. Integration of the processor 53 in a laser driver in the form of an ASIC would also be possible.

The circuit or procedure according to the invention and as described here is suitable, for example, to a high degree for a laser distance measuring device with burst-modulated laser radiation, in accordance with the principle as described in EP 01 957 668, for example. According to the invention, in this case the criteria for the laser safety can be adhered to without using a monitor diode, as a result of which a more compact, more cost-efficient and less complex overall system is produced. Such a distance measuring device has a transmission unit for transmitting the laser light pulses 18 with the laser driver 10 and the laser diode 3, a reception unit for receiving a rejected component of the laser light pulses 18 with a photosensitive electronic component and an evaluation unit for determining a distance from a target object on the basis of a propagation time of the laser light pulses 18 from the distance measuring device to the target object and back again.

Figure 8:
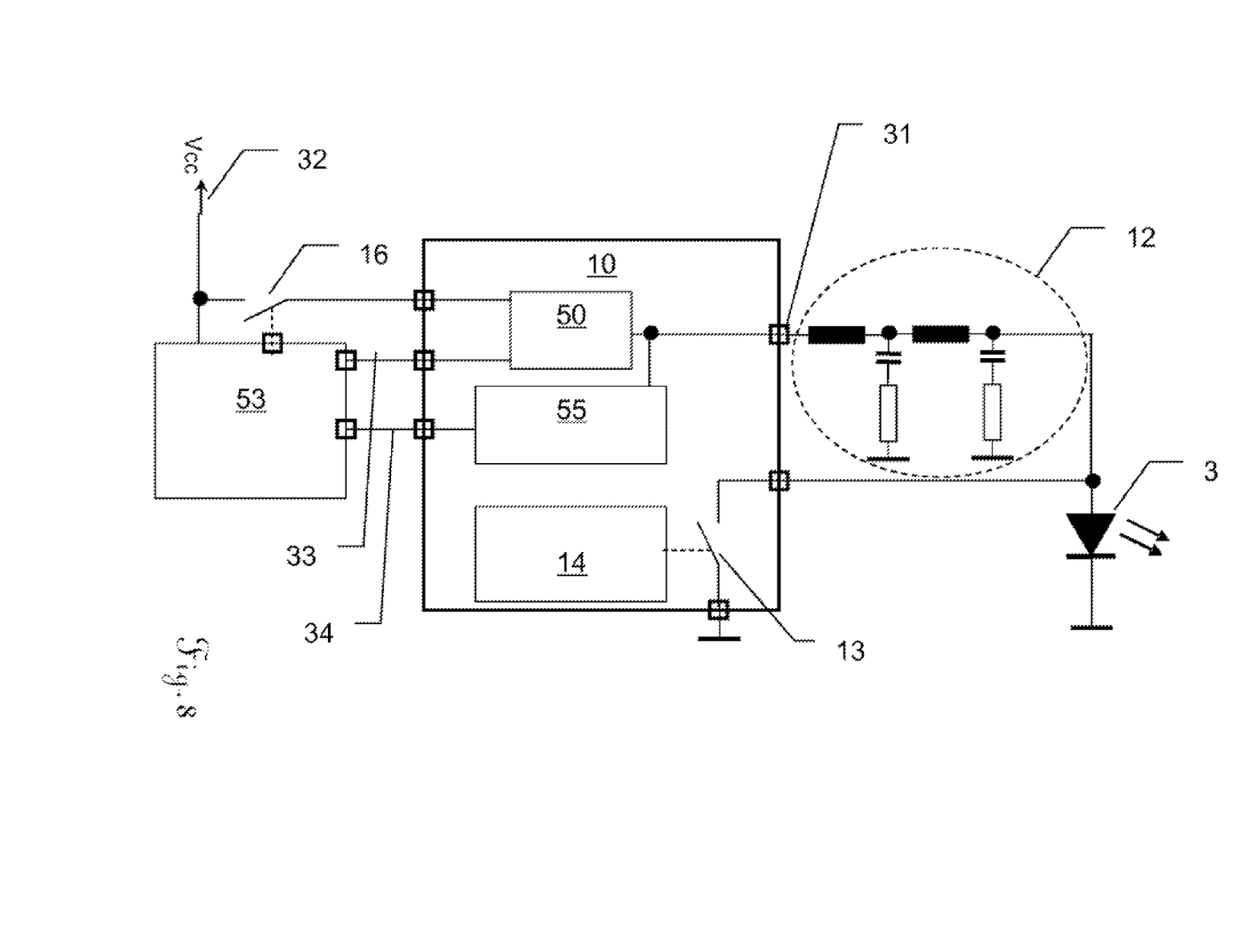
FIG. 8 shows an exemplary block circuit diagram of a fifth embodiment of a laser driver according to the invention with alternative overvoltage shutdown and a pulse-shaping network.

FIG. 8 represents the already mentioned voltage monitoring by means of a comparator component 55. The comparator 55 compares the voltage 31 with a maximum permissible value, which is below the laser threshold voltage, and outputs a digital fault signal 34 in the event of this laser threshold voltage being exceeded, on the basis of which a further supply of supply energy is prevented, for example by means of the switch 16 shown. In this figure, the inductive component 12 is in the form of an exemplary pulse-shaping network, as has already been explained further above. The example shown has an in principle inductive characteristic owing to the two inductances, but the shape of the current/voltage pulse which can be generated is influenced by the further components. Specifically, the edge gradient and/or peak values of the electrical pulse can be influenced, for example in order to protect the switch 13 from overload or to adapt the optical pulse in terms of its time profile. A variation and/or design of the pulse-shaping network shown by way of example here for meeting the application-specific requirements is conventional to a person skilled in the art or can be determined by simulation or test setups.

What is claimed is:

1. An electro-optical distance measuring device comprising:
 a laser driver for a laser diode for emitting laser light pulses;
 a laser diode voltage supply, for providing a voltage below a laser threshold voltage of the laser diode;
 an inductive component in a supply path of the laser diode and connected to the laser diode in the circuit between the voltage supply and the laser diode; and
 an electronic switching element, in parallel with the laser diode, the electronic switching element being arranged interactively in such a way that:
  in a first switching position of the switching element, a current flow through the inductive component can be produced; and
  in a second switching position of the switching element, the current flow through the inductive component can be conducted through the laser diode; and
 a voltage monitoring circuit of the laser diode voltage supply for detecting a value of the voltage that is above the laser threshold voltage, using a voltage comparator, wherein, by changing from the first to the second switching position, one of the laser light pulses can be emitted and, in the steady-state first and the steady-state second switching positions, no laser light can be emitted.

2. The distance measuring device as claimed in claim 1, wherein the voltage monitoring circuit is effected by a short-circuit detection circuit of a voltage regulator.

3. The distance measuring device as claimed in claim 1, further comprising:
 a further switching element for isolating the supply path of the laser diode or the entire laser driver such that no laser light can be emitted.

4. The distance measuring device as claimed in claim 3, wherein:
 the further switching element is actuated on the basis of the detection of the voltage monitoring circuit.

5. The distance measuring device as claimed in claim 1, further comprising:
 a further switching element for short-circuiting the laser diode with the result that, in the closed state of said further switching element, no laser light can be emitted.

6. The distance measuring device as claimed in claim 5, wherein:
 the further switching element is actuated on the basis of the detection of the voltage monitoring circuit.

7. The distance measuring device as claimed in claim 1, wherein:
 the inductive component is in the form of a pulse-shaping network for shaping the emitted laser light pulses; and
 said pulse-shaping network demonstrates a dominantly inductive response.

8. The distance measuring device as claimed in claim 7, wherein:
 the switching element for laser pulse emission is actuated by a configurable pulse-width modulation unit; and wherein the energy of the laser light pulse and/or an intensity profile of the laser light pulse can be configured by the pulse width modulation.

9. The distance measuring device as claimed in claim 1, wherein:
the laser driver, with the exception of the laser diode and the inductive component, is embodied as an ASIC, in a purely digital actuation interface.

10. A method for pulsed operation of a laser diode of an electro-optical distance measuring device using a supply voltage that is below the laser threshold voltage as claimed in claim 9, wherein:
the inductive component is arranged in series with the laser diode; and
the laser diode can be short-circuited by the switching element arranged in parallel with the laser diode.

11. The distance measuring device as claimed in claim 1, further comprising:
a transmission unit for emitting the laser light pulses with the laser driver and the laser diode;
a reception unit for receiving a rejected component of the laser light pulses with a photosensitive electronic component; and
an evaluation unit for determining a distance from a target object on the basis of a propagation time of the laser light pulses from the distance measuring device to the target object and back again.

12. The distance measuring device as claimed in claim 11, wherein:
the laser light pulses are emitted as burst-like laser pulse packets.

13. A method for generating a laser pulse by means of a laser diode in an electro-optical distance measuring device, comprising:
supplying a supply voltage, which is below a laser threshold voltage of the laser diode, to the laser diode via an inductive component;
building up a current through the inductive component by closing a switching element arranged in parallel with the laser diode;
detecting a fault case by monitoring the supply voltage to ascertain whether the laser threshold voltage has been reached or exceeded; and
decreasing the current through the inductive component across the laser diode while emitting the laser pulse by opening the switching element.

14. The method as claimed in claim 13, further comprising:
isolating or short-circuiting the laser diode by means of a further switching element in the event of a fault.

15. The method as claimed in claim 13, wherein:
the monitoring is performed by short-circuit detection at a circuit which reduces the supply voltage at a step-down fixed voltage regulator.

16. A method for ensuring single-fault fail safety without the use of monitor diodes in a laser diode driver in an electro-optical distance measuring device by means of a method for generating a laser pulse by means of a laser diode in an electro-optical distance measuring device, the method comprising:
supplying a supply voltage, which is below a laser threshold voltage of the laser diode, to the laser diode via an inductive component;
building up a current through the inductive component by closing a switching element arranged in parallel with the laser diode; and
decreasing the current through the inductive component across the laser diode while emitting the laser pulse by opening the switching element.

17. A laser driver for a laser diode for emitting laser light pulses comprising:
a laser diode voltage supply, for providing a voltage below a laser threshold voltage of the laser diode;
an inductive component in a supply path of the laser diode and connected to the laser diode in the circuit between the voltage supply and the laser diode;
an electronic switching element, in parallel with the laser diode, the electronic switching element being arranged interactively in such a way that:
in a first switching position of the switching element, a current flow through the inductive component can be produced; and
in a second switching position of the switching element, the current flow through the inductive component can be conducted through the laser diode, wherein:
by changing from the first to the second switching position, one of the laser light pulses can be emitted and, in the steady-state first and steady-state second switching position, no laser light can be emitted; and
a voltage monitoring circuit of the laser diode voltage supply for detecting a value of the voltage that is above the laser threshold voltage, using a voltage comparator, wherein the voltage monitoring circuit is effected by a short-circuit detection circuit of a voltage regulator.

* * * * *